United States Patent
Hall (10) Patent No.: US 6,850,853 B2
(45) Date of Patent: Feb. 1, 2005

(54) METHOD AND APPARATUS FOR DISPLAYING HELP SCREEN INFORMATION FOR MEASUREMENT DEVICE

(75) Inventor: Stuart Hall, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 178 days.

(21) Appl. No.: 10/042,771

(22) Filed: Jan. 9, 2002

(65) Prior Publication Data

US 2002/0087279 A1 Jul. 4, 2002

Related U.S. Application Data

(63) Continuation-in-part of application No. 09/159,013, filed on Sep. 23, 1998, now abandoned.

(51) Int. Cl.[7] ............................................. G06F 19/00
(52) U.S. Cl. ........................................ 702/68; 345/771
(58) Field of Search ........................ 702/68, 66, 17.6; 345/440, 172, 841, 771; 706/45; 708/83, 84, 142–146

(56) References Cited

U.S. PATENT DOCUMENTS

| | | | |
|---|---|---|---|
| 4,829,293 A | | 5/1989 | Schlater |
| 5,258,748 A | * | 11/1993 | Jones .......................... 345/172 |
| 5,737,248 A | | 4/1998 | Kawasaki et al. |
| 5,831,598 A | * | 11/1998 | Kauffert et al. ............. 345/168 |
| 5,929,838 A | | 7/1999 | Hall |
| 5,953,009 A | * | 9/1999 | Alexander ................... 345/771 |
| 5,977,976 A | | 11/1999 | Maeda |
| 6,021,403 A | * | 2/2000 | Horvitz et al. ................ 706/45 |

* cited by examiner

Primary Examiner—John Barlow
Assistant Examiner—Xiuqin Sun (57) ABSTRACT

A method and apparatus for displaying help screen information for measurement devices. The invention includes a measurement device for generating measurement information, and a display coupled with the measurement device for displaying the measurement information, A control panel has a plurality of keys each coupled with the measurement device for controlling a respective operation of the measurement device. A timer is coupled with the control panel for sensing duration of key activation during which a user activates any of the keys of the control panel. A controller is coupled with the display for displaying help screen information in context of the respective operation of the measurement device in response to each key activation, when the duration of key activation is greater than a predetermined amount of time.

5 Claims, 10 Drawing Sheets

METHOD AND APPARATUS FOR DISPLAYING HELP SCREEN INFORMATION FOR MEASUREMENT DEVICE

CONTINUING APPLICATION DATA

This application is a continuation-in-part application claiming priority to U.S. application, Ser. No. 09/159,013 filed Sep. 23, 1998 now abandoned.

FIELD OF THE INVENTION

The invention generally relates to measurement instrumentation, and more specifically relates to controls and displays of such measurement instrumentation.

BACKGROUND OF THE INVENTION

Various types of measurement instrumentation are known in the art. In particular, today's measurement instruments such as logic analyzers, spectrum analyzers, oscilloscopes and the like provide a vast array of sophisticated measurement operations, functions and modes. These are needed for examining complex modern computer systems, communications systems and the like. Unfortunately, so many different capabilities and measurement operations have made today's measurement instruments more difficult to use.

Manufacturers of quality measurement instruments provide comprehensive users manuals explaining instrument operation. However, as measurement instruments have become more sophisticated, such user manuals have become thick, heavy and more complex. In the case of portable measurement instruments, it is inconvenient to carry a heavy manual along with the portable instruments. Additionally, a user motivated to gain a clearer understanding of a particular measurement operation bears a burden of so called "manual labor," searching through numerous pages of the user manual for information about the particular measurement operation.

What is needed is a convenient method and apparatus for displaying help screen information for measurement devices.

SUMMARY OF THE INVENTION

The invention provides a convenient method and apparatus for displaying help screen information for measurement devices.

Briefly and in general terms, the invention includes a measurement device for generating measurement information, and a display coupled with the measurement device for displaying the measurement information. A control panel has a plurality of keys each coupled with the measurement device for controlling a respective operation of the measurement device.

A timer is coupled with the control panel for sensing duration of key activation during which a user activates any of the keys of the control panel. A controller is coupled with the control panel and the timer for initiating the respective operation of the measurement device in response to each key activation, when the duration of key activation is less than a predetermined amount of time. The controller is also coupled with the display for displaying help screen information in context of the respective operation of the measurement device in response to each key activation, when the duration of key activation is greater than the predetermined amount of time. The controller is adapted for causing the display to cease displaying the help screen information when the user deactivates the key.

A user motivated to gain a clearer understanding of a particular measurement operation can find needed information easily, because the help screen information is advantageously displayed in context of the measurement operation associated with the corresponding key activated by the user. Later, it is easy for the user to refresh his recollection of the needed information, since the user can find the needed information easily. Once his recollection has been refreshed, the invention provides the user with an easy way to cease displaying the help screen information, by the user deactivating the key. Accordingly, the display becomes completely available for displaying the measurement information, as the user resumes using the instrument for measurement operations. It is theorized by the inventor that such ease of use of the invention advantageously lowers a so called "learning curve" for users of the measurement instrumentation.

Another advantage of the invention is efficient use of control panel space. As measurement instruments become more sophisticated, a greater number of keys for controlling measurement operations are needed. However, the control panel space is limited. The invention advantageously provides display of help screen information based on duration of key activation. Accordingly, there is no need for additional help keys dedicated solely to use in displaying help screen information. In this way, control panel space remains available for the keys that control measurement operations.

Furthermore, if the instrument includes a large number of keys, additional dedicated help keys would be difficult for the user to find. The invention obviates this problem since no dedicated help keys are needed.

Other aspects and advantages of the present invention will become apparent from the following detailed description, taken in conjunction with the accompanying drawings, illustrating by way of example the principles of the invention.

DETAILED DESCRIPTION OF PREFERRED EMBODIMENT

Figure 1:
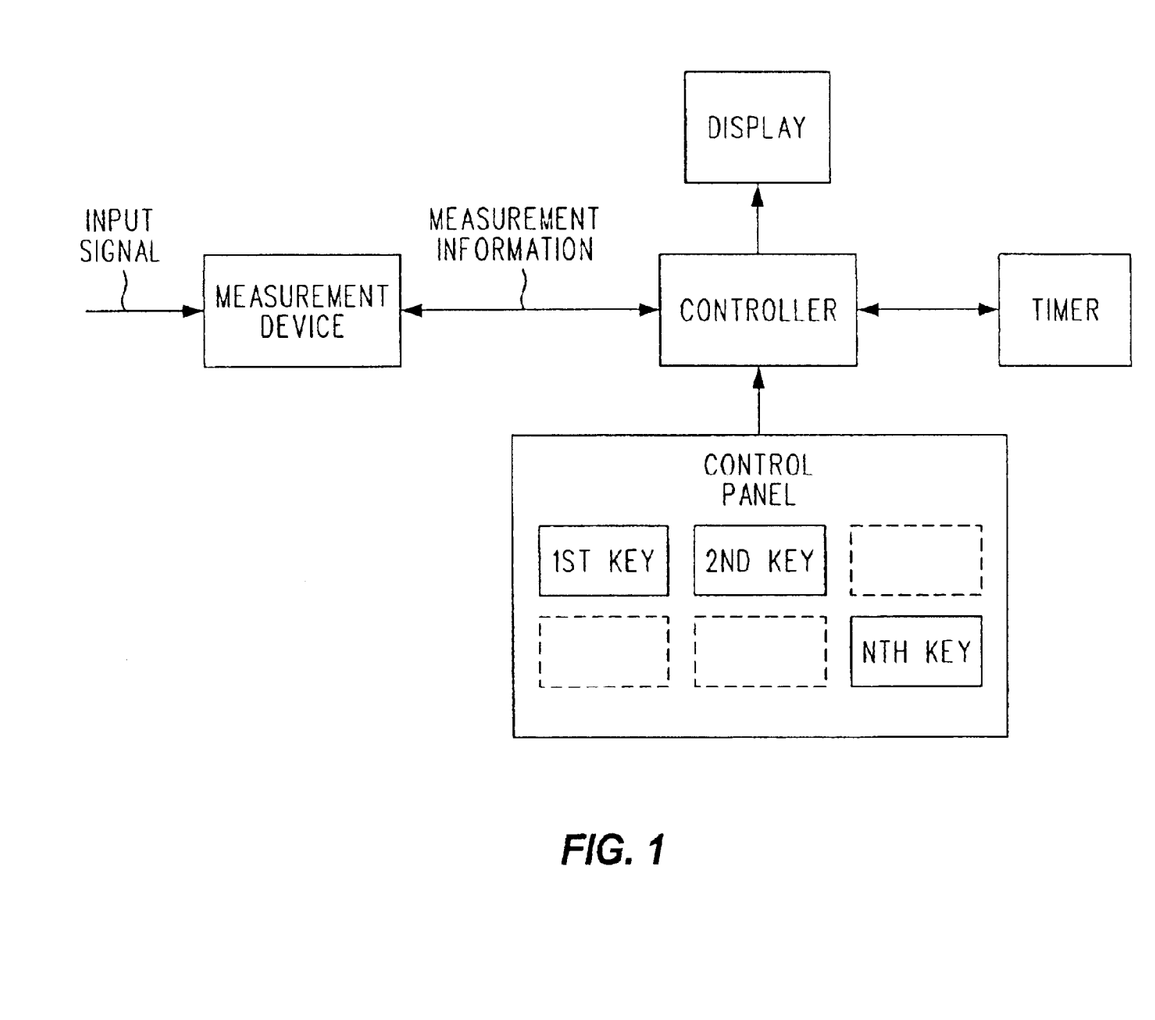
FIG. 1 is a simplified block diagram illustrating a preferred embodiment of the invention.

FIG. 1 is a simplified block diagram illustrating a preferred embodiment of the invention. As shown the invention includes a measurement device for measuring one or more input signals and generating measurement information and a display (preferably a CRT—Cathode Ray Tube or Liquid Crystal Display—LCD). The display is coupled with the measurement device (preferably through a controller) for displaying the measurement information. A control panel has a plurality of keys each coupled with the measurement device for controlling a respective operation of the measurement device.

Although the block diagram of FIG. 1 is simplified, it should be understood that the invention is preferably embodied in a measurement instrument such as a logic analyzer, spectrum analyzer, oscilloscope or the like. For example, in the case where the measurement instrument is a digitizing oscilloscope, the measurement device in FIG. 1 includes suitable input attenuators, amplifiers, time base and digitizer. Similarly, in the case of the digitizing oscilloscope, the measurement data displayed on the display of FIG. 1 includes graphical waveform information based on an oscillating signal measured by the digitizing oscilloscope. In the case of the digitizing oscilloscope, each of the keys control at least one respective operation of the measurement device, such as setting edge trigger, single sweep, main/delayed sweep, run/stop sweep and the like. Preferably, the controller includes one or more suitably programmed microprocessors.

As shown in FIG. 1, a timer is coupled with the control panel for sensing duration of key activation during which a user activates any of the keys of the control panel. In the preferred embodiment the timer is embodied in software running on the microprocessor. The controller is coupled with the control panel and the timer for initiating the respective operation of the measurement device in response to each key activation, when the duration of key activation is less than a predetermined amount of time.

For example, in one preferred embodiment the predetermined amount of time is several seconds. Activation of the key to initiate operation of the measurement device, for example, includes the user manually depressing a key for less than several seconds and releasing the key to initiate run or stop sweep operations. However, it should be understood that the invention is not strictly limited to the predetermined time being several seconds. In other preferred embodiments, ergonomic factors favor use of a longer or shorter time in the invention, with beneficial results.

As shown in FIG. 1, the controller is also coupled with the display for displaying help screen information in context of the respective operation of the measurement device in response to each key activation, when the duration of key activation is greater than the predetermined amount of time. For example, in the preferred embodiment, when the user manually depresses the key associated with run/stop sweep operations for more than several seconds, the controller causes the display of help screen information in context of run control and run/stop sweep operations, so as to guide the user in appropriate use of the run/stop sweep operations. As a further example, when the user manually depresses the key associated with setting the input attenuator for more than several seconds, the controller causes the display of help screen information in context of the input attenuator of the oscilloscope, so as to guide the user in setting the input attenuator appropriately.

The controller is adapted for causing the display to cease displaying the help screen information when the user deactivates the key. For example, when the user is done with the help screen information in context of the run/stop sweep operations of the oscilloscope, the user releases the key associated with controlling the run/stop sweep operations, and the controller causes the display to cease displaying such help screen information.

FIGS. 2A through 2D are successive views of a simplified measurement instrument control panel and display, to illustrate how the preferred embodiment of the invention displays help screen information.

Within the measurement instrument is the measurement device for generating the measurement information. In this example, the measurement instrument is the digitizing oscilloscope, so that the measurement device includes the input attenuators, amplifiers, time base and digitizer.

FIGS. 2A through 2D show the display coupled with the measurement device, for displaying the measurement information, such as graphical waveform information based on the oscillating signals measured by the digitizing oscilloscope. Also shown is the control panel having the plurality of keys each coupled with the measurement device for controlling the respective operation of the measurement device. For the digitizing oscilloscope, each of the keys control at least one respective operation of the measurement device, such as setting edge trigger, single sweep, main/delayed sweep, run/stop sweep and the like.

In the preferred embodiment, some of the keys are each permanently assigned to controlling respective one or two measurement operations, such as the keys shown positioned to the right of the display, on a right half of the control panel FIGS. 2A through 2D. Others of the keys are so called "Soft-Keys" that are flexibly assigned by software to controlling a large number of different measurement operations. Such Soft-Keys are the horizontal row of six rectangular keys, which are shown positioned just below and adjacent to the display in FIGS. 2A through 2D. Typically, the display shows various changeable display characters, just above each Soft-Key, so as to flexibly label a respective measurement operation that is currently assigned thereto. For the sake of simplicity, the Soft-Key label characters are not shown on the display in the figures.

In accordance with the principles of the invention, the timer is coupled with the control panel for sensing duration of key activation during which the user activates any of the keys of the control panel. Of course, in the preferred embodiment, the timer is within the digitizing oscilloscope and therefore would not be visible in FIGS. 2A through 2D. However, for purposes of illustrating passage of time, and illustrating how the timer operates in the invention, a notional clock face is drawn above the digitizing oscilloscope in FIGS. 2A through 2D.

Figure 2A:
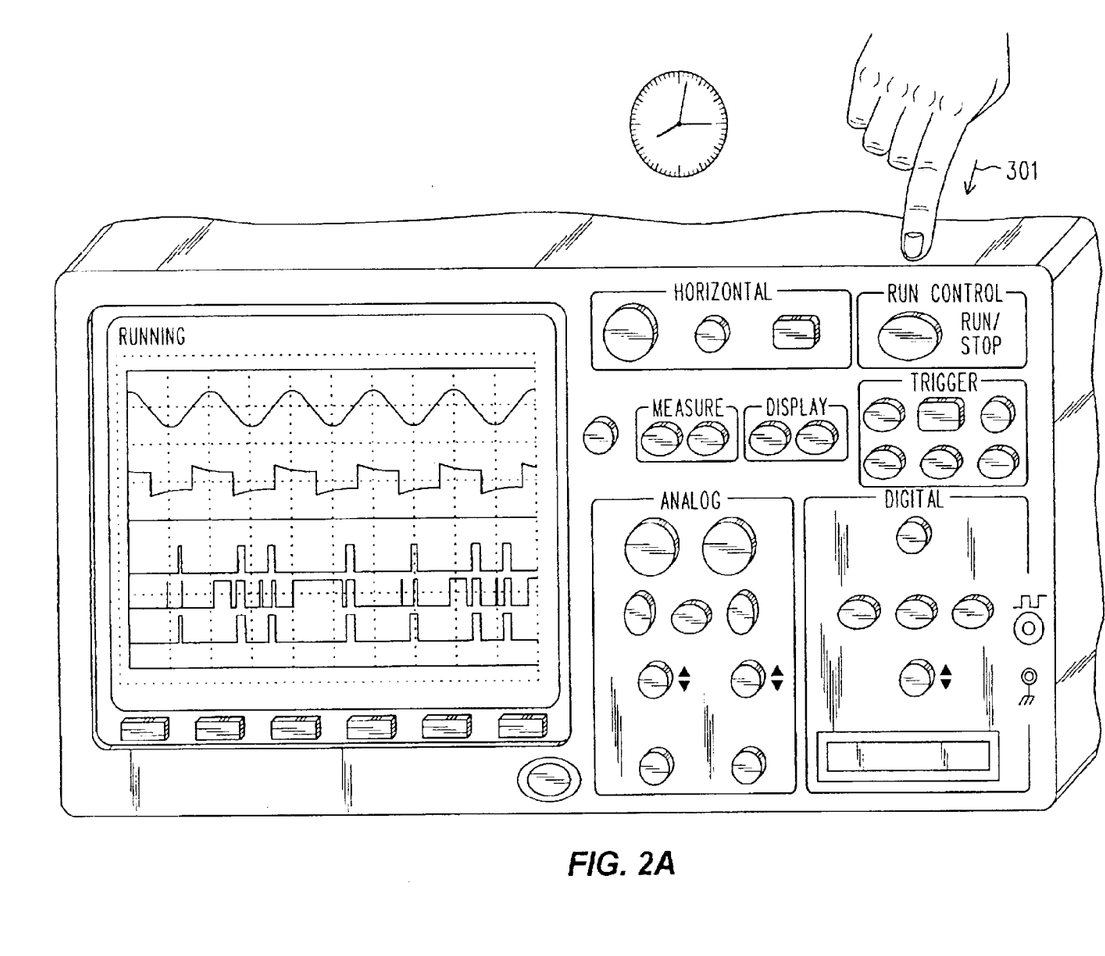
FIGS. 2A through 2D are successive views of a simplified measurement instrument control panel and display, to illustrate how the preferred embodiment of the invention displays help screen information.
Figure 2B:
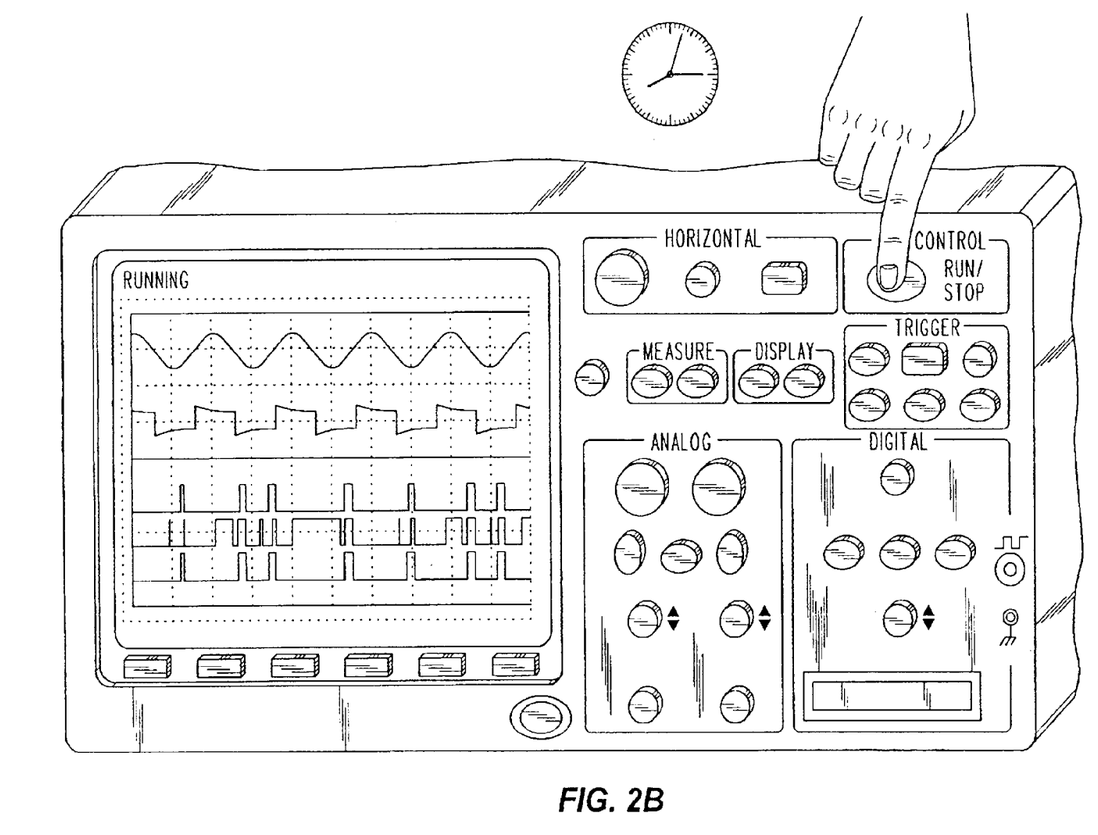
Figure 2C:
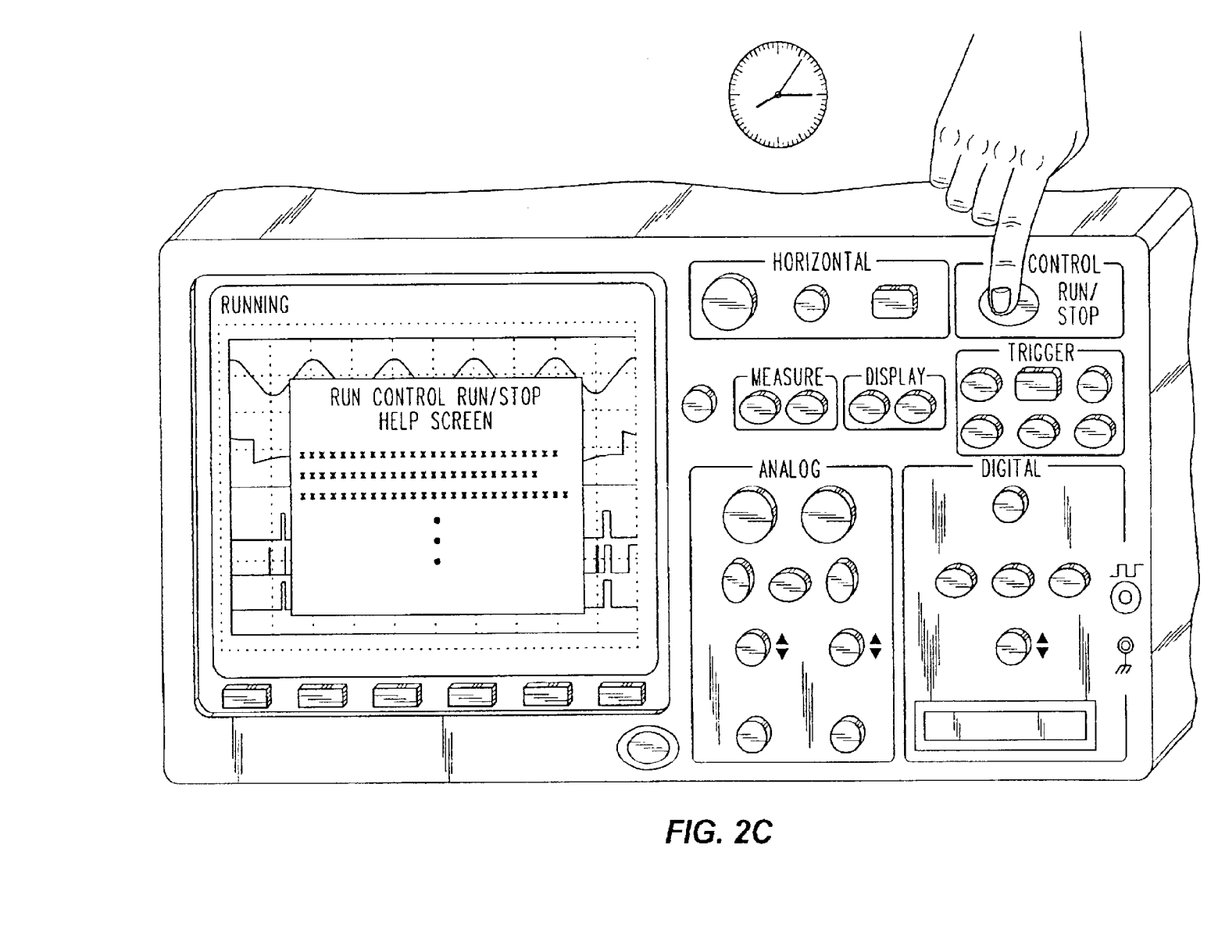

FIG. 2A shows a hand of the user with index finger extended and approaching in a direction 301 towards the control panel of the digitizing oscilloscope. As illustrated in FIGS. 2B and 2C, the controller is coupled with the display for displaying help screen information in context of the respective operation of the measurement device in response to each key activation, when the duration of key activation is greater than the predetermined amount of time. More particularly, when the user manually depresses the key associated with the run/stop sweep operations for more than several seconds (as illustrated by the notional clock face), the controller causes the display of help screen information in context of run control and the run/stop sweep operations, so as to guide the user in appropriate use of the run/stop sweep operations.

Figure 2D:
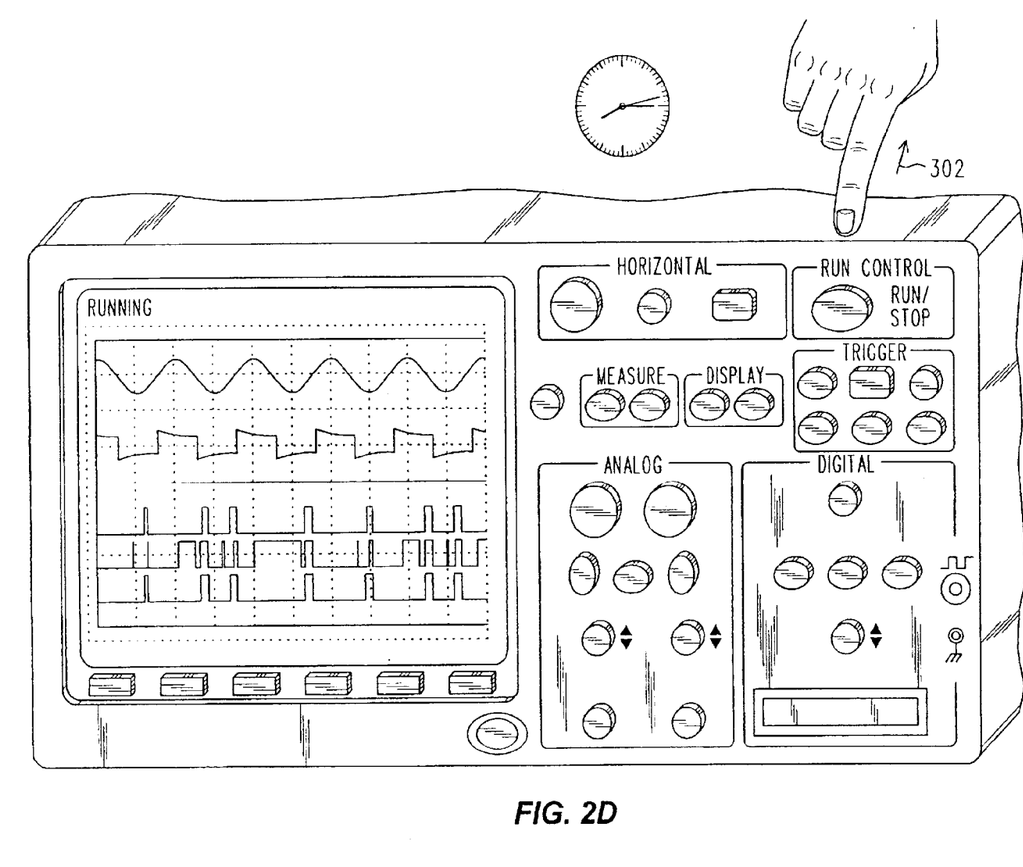

The controller causes the display to cease displaying the help screen information when the user deactivates the key. As shown in FIG. 2D, when the user is done with the help screen information in context of the run/stop sweep operations of the oscilloscope, the user releases the key associated with controlling the run/stop sweep operations, and the controller causes the display to cease displaying such help screen information. FIG. 2D shows the hand of the user withdrawing in a direction 302 away from the control panel of the digitizing oscilloscope.

Figure 3A:
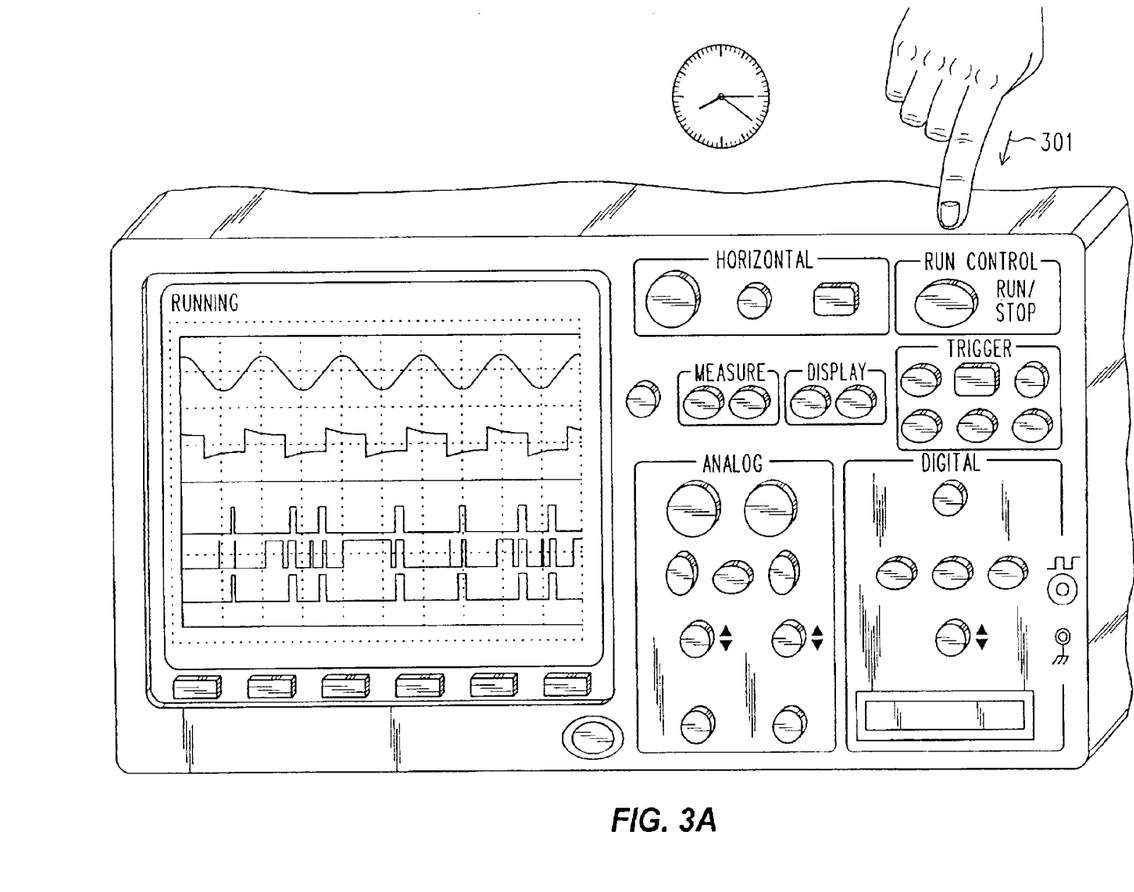
FIGS. 3A through 3C are successive views of the simplified measurement instrument control panel and display, to illustrate how the preferred embodiment of the invention initiates a measurement operation.
Figure 3B:
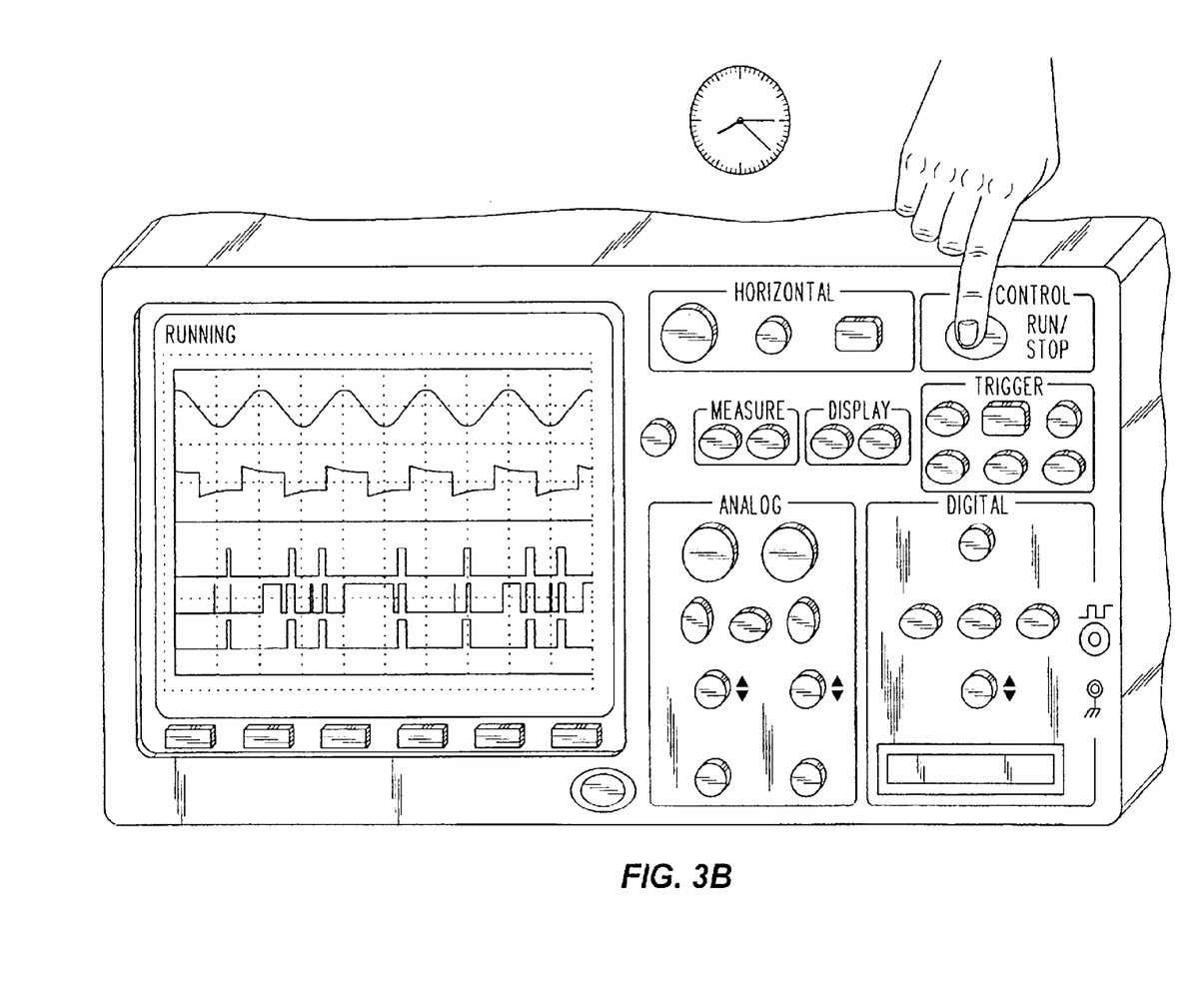
Figure 3C:
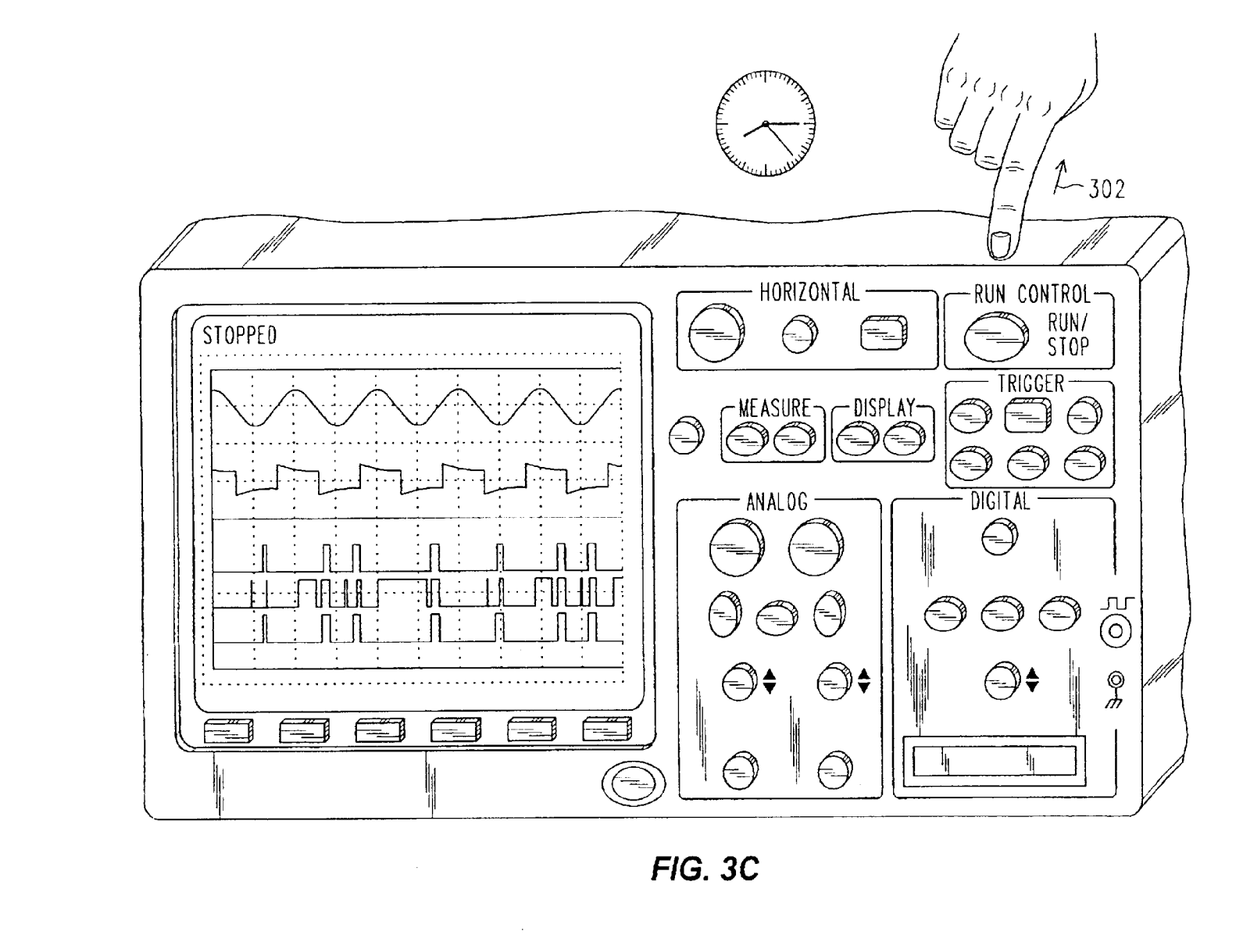

FIGS. 3A through 3C are successive views of the simplified measurement instrument control panel and display, to illustrate how the preferred embodiment of the invention initiates a measurement operation. The controller is coupled with the control panel and the timer for initiating the respective operation of the measurement device in response to each key activation, when the duration of key activation is less than the predetermined amount of time (for example, several seconds). In particular, FIGS. 3A through 3C show the user manually depressing the key associated with controlling the run/stop sweep operations for less than several seconds and releasing the key to initiate the stop sweep operation.

FIG. 3A shows the hand of the user approaching in the direction 301 towards the control panel of the digitizing oscilloscope. The indicator in the upper left hand corner of the display shows an operating state of the measurement device as RUNNING, in accordance with the run sweep operation. FIG. 3B shows the hand of the user manually depressing the key, while the indicator in the upper left hand corner of the display still shows the operating state of the measurement device as RUNNING.

FIG. 3C shows the user having released the key to initiate the stop sweep operation. The indicator in the upper left hand corner of the display shows an operating state of the measurement device as STOPPED, in accordance with the stop sweep operation. The key was depressed for less than the several seconds, as indicated by the notional clock face in FIG. 3C, in comparison with the notional clock face in FIG. 3B. The hand of the user is shown withdrawing in the direction 302 away from the control panel of the digitizing oscilloscope in FIG. 3C.

Figure 4:
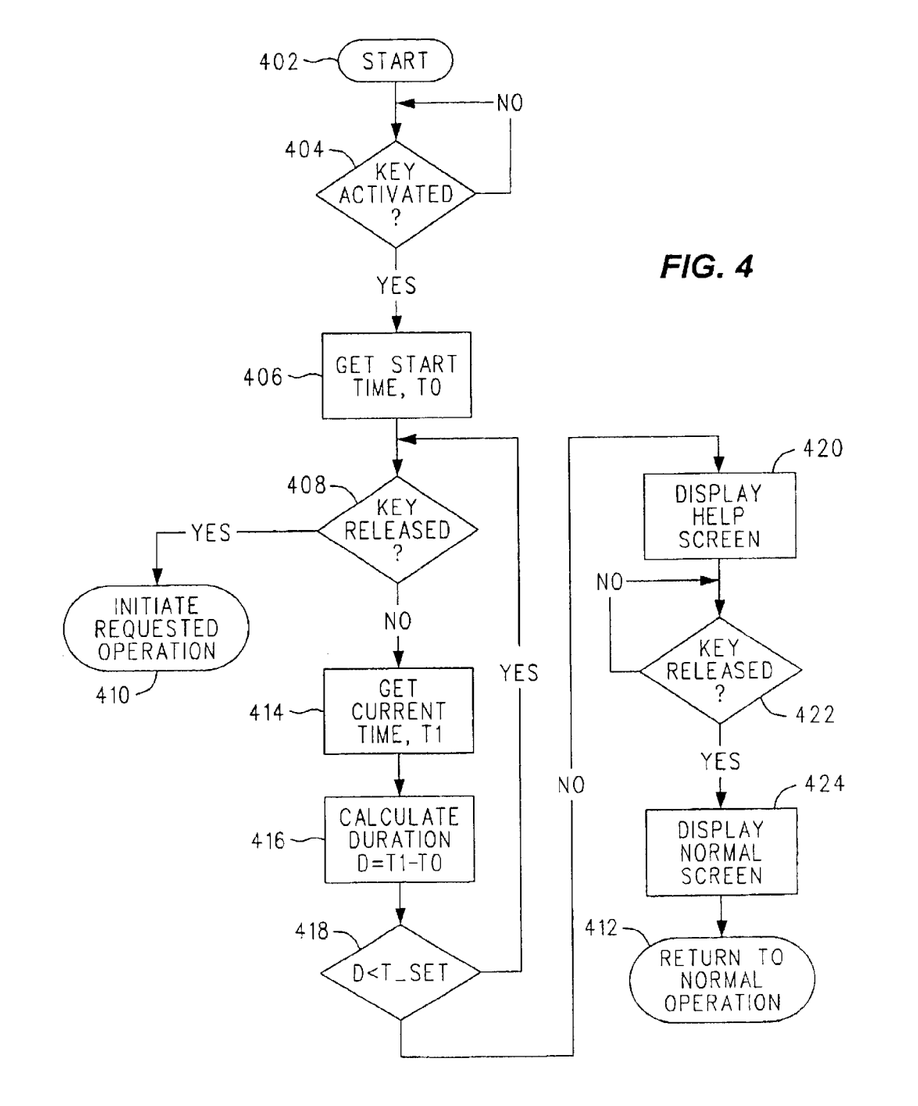
FIG. 4 is a flow chart illustrating the operation of the preferred embodiment of the invention.

A flow chart depicting the operation of one embodiment of the controller of the present invention is shown in FIG. 4. Operation commences at start block 402. At decision block 404 a check is made to determine if any key has been activated (pressed). In this embodiment, the check is made repeatedly, as depicted by the negative branch from decision block 404, until a key is activated. In an alternative embodiment, key activation is used to start the process, so the check is not required. When a key is activated, as depicted by the positive branch from decision block 404, the start time T0 is read from the timer at block 406. Alternatively, a timer may be started, in which case T0 is zero. At decision block 408 a check is made to determine if the key has been deactivated (released). If the key has been released, as depicted by the positive branch from decision block 408, the operation of the measurement device is initiated according to which key has been activated. This is depicted by block 410. If the key has not been released, as depicted by the negative branch from decision block 408, the current time T1 is read from the timer at block 414. At block 416, the duration D of the key activation is calculated by subtracting the start time T0 from the stop time T1. At decision block 418, a check is made to determine if the duration of key activation is less than a prescribed time T_SET. If the duration of key activation is less than T_SET, as depicted by the positive branch from decision block 414, the flow returns to decision block 408. If the duration of key activation is greater than or equal to T_SET, as depicted by the negative branch from decision block 418, a help screen is displayed corresponding to the operation prescribed to the activated key. This is depicted by block 420. At decision block 422, a check is made to determine if the key has been deactivated (released). If the key has been released, as depicted by the positive branch from decision block 422, the normal screen is displayed at block 424 and the measurement device returns to normal operation at block 412. As depicted by the negative branch from decision block 422, the system continues to check the status of the key until it is released. During this time, the help screen is displayed.

Figure 5A:
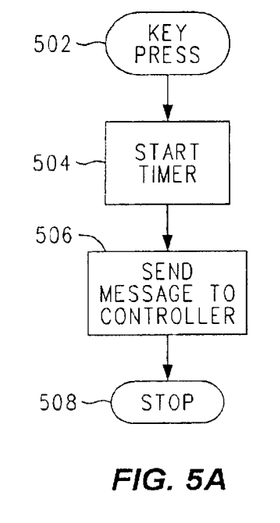
FIGS. 5A through 5C are flow charts illustrating the operation of a further embodiment of the invention.
Figure 5B:
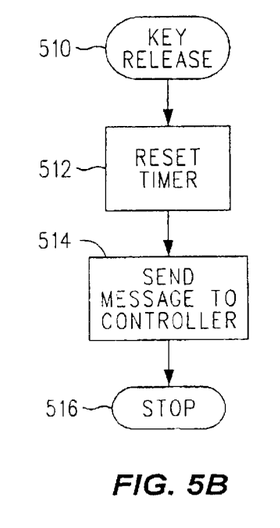
Figure 5C:
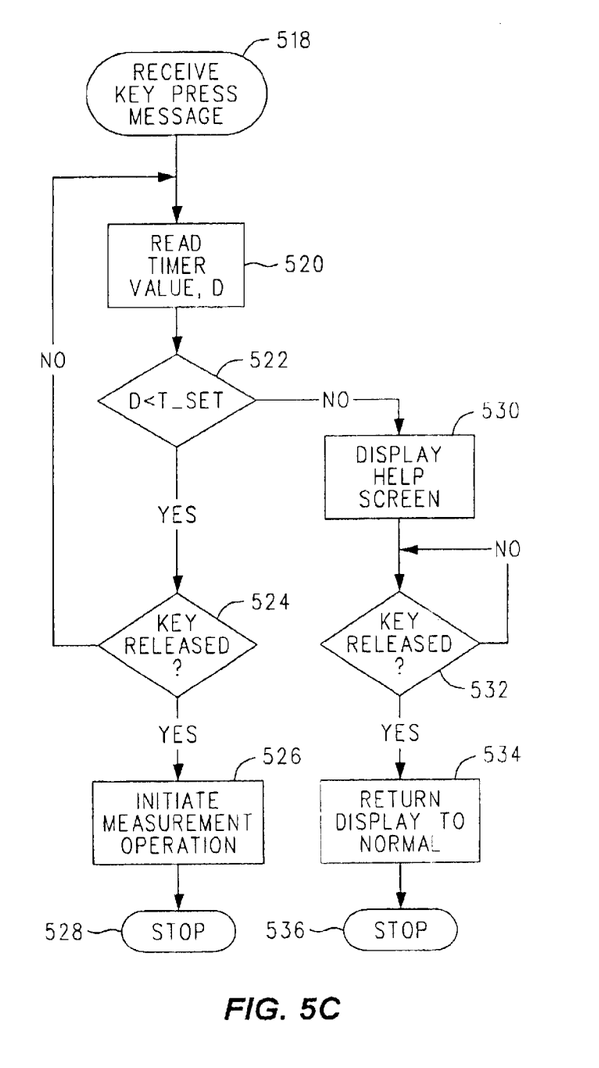

A flow chart depicting the operation of a further embodiment of the controller of the present invention is shown in FIGS. 5A–5C. FIG. 5A shows the operation commencing with key press 502. In response to the key press, a timer is started at block 504. At 506 a message is sent to the controller indicating that a key press has been made. The operation ends at termination block 508. FIG. 5B shows the sequence of operation commencing with a key release 510. In response to the key release, the timer is reset at block 512. At 514 a message is sent to the controller indicating that a key has been released. The operation ends at termination block 516. FIG. 5C shows the operation of the controller. Operation begins when a keypress message is received at block 518. At block 520 the timer value, D, is read. This indicates the length of time that has passed since the key was pressed. At decision block 522 the timer value is compared with a prescribed time T_SET. If the duration of key activation is less than T_SET, as depicted by the positive branch from decision block 522, a check is made at decision block 524 to determine if key-release message has been received by the controller. If a key-release message has been received, as indicated by the positive branch from decision block 524, the corresponding measurement operation is initiated at block 528 and operation stops at termination block 528. If a key-release message has not been received, as indicated by the negative branch from decision block 524, operation returns to block 520 and the timer value is again read. If the duration of key activation is greater than or equal to T_SET, as depicted by the negative branch from decision block 522, a help screen is displayed corresponding to the operation prescribed to the activated key. This is depicted by block 530. At decision block 532 a check is made to determine if a key-release message has been received. If a message has been received, as indicated by the positive branch from decision block 532, the normal screen is displayed instead of the help screen information. If the key has not been released, as indicated by the negative branch from decision block 532, the system checks again to determine if the key has been released.

As discussed, the invention provides a convenient method and apparatus for displaying help screen information for measurement devices. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

What is claimed is:

1. An apparatus comprising:
   a measurement device for receiving one or more input signals and generating measurement information related to said input signals;
   a display coupled with the measurement device for displaying the measurement information;
   a control panel having a plurality of keys each coupled with the measurement device for controlling a respective operation of the measurement device;
   a timer coupled with the control panel for sensing duration of key activation during which a user activates a key of the plurality of keys of the control panel; and
   a controller coupled with the control panel and the timer for initiating the respective operation of the measurement device in response to each key activation, when the duration of key activation is less than a predetermined amount of time;

wherein the controller is coupled with the display for displaying help screen information in context of the respective operation of the measurement device in response to each key activation, when he duration of key activation is greater than the predetermined amount of time.

2. An apparatus as in claim 1 wherein the controller is adapted for causing the display to cease displaying the help screen information when the user deactivates the key.

3. A method comprising:

receiving one or more input signals;

generating measurement information related to said input signals using a measurement device;

displaying the measurement information using a display coupled with the measurement device;

controlling a respective operation of the measurement device using a control panel having a plurality of keys each coupled with the measurement device;

sensing duration of key activation during which a user activates a key of the plurality of keys of the control panel;

initiating the respective operation of the measurement device in response to each key activation, when the duration of key activation is less than a predetermined amount of time;

displaying help screen information in context of the respective operation of the measurement device in response to each key activation, when the duration of key activation is greater than the predetermined amount of time; and ceasing display of the help screen information when the user deactivates the key.

4. An apparatus, comprising:

a measurement device for receiving one or more input signals and generating measurement information related to said input signals;

a display coupled with the measurement device for displaying the measurement information;

a control panel having a plurality of keys each coupled with the measurement device for controlling a respective operation of the measurement device; and a controller coupled with the control panel and including a timer function for sensing duration of key activation during which a user activates a key of the plurality of keys of the control panel;

wherein the controller initiates the respective operation of the measurement device in response to each key activation, when the duration of the key activation is less than a predetermined amount of time; and wherein the controller is coupled with the display for displaying help screen information in context of the respective operation of the measurement device in response to each key activation, when the duration of the key activation is greater than the predetermined amount of time.

5. An apparatus as in claim 4 wherein the controller is adapted for causing the display to cease displaying the help screen information when the user deactivates the key.

* * * * *